United States Patent
Nihei et al.

(10) Patent No.: US 8,097,493 B2
(45) Date of Patent: Jan. 17, 2012

(54) METHOD OF MANUFACTURING SEMICONDUCTOR LIGHT EMITTING ELEMENTS

(75) Inventors: Noriko Nihei, Tokyo (JP); Tatsuma Saito, Tokyo (JP); Yusuke Yokobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/917,682

(22) Filed: Nov. 2, 2010

(65) Prior Publication Data

US 2011/0104835 A1  May 5, 2011

(30) Foreign Application Priority Data

Nov. 4, 2009  (JP) ................................. 2009-252902

(51) Int. Cl.
*H01L 21/00* (2006.01)
*H01L 21/50* (2006.01)
*H01L 21/48* (2006.01)
*H01L 21/44* (2006.01)
*H01L 21/46* (2006.01)
*H01L 21/30* (2006.01)

(52) U.S. Cl. .............. 438/113; 438/33; 438/34; 438/68; 438/459; 438/460; 257/E21.108; 257/E21.117; 257/E21.131

(58) Field of Classification Search ........... 257/E21.108, 257/E21.117, E21.131
See application file for complete search history.

(56) References Cited

U.S. PATENT DOCUMENTS

| | | | | |
|---|---|---|---|---|
| 7,183,136 B2 * | 2/2007 | Hashimura et al. | ........... | 438/113 |
| 7,579,202 B2 * | 8/2009 | Hsu et al. | ......................... | 438/33 |
| 7,732,236 B2 * | 6/2010 | Nakahata et al. | ............... | 438/46 |
| 7,776,637 B2 * | 8/2010 | Leem | ................. | 438/46 |
| 2005/0186760 A1 * | 8/2005 | Hashimura et al. | ........... | 438/460 |

FOREIGN PATENT DOCUMENTS

| | | |
|---|---|---|
| JP | 2006-073619 A | 3/2006 |
| JP | 2007-134415 A | 5/2007 |

* cited by examiner

*Primary Examiner* — Mohsen Ahmadi
(74) *Attorney, Agent, or Firm* — Holtz, Holtz, Goodman & Chick, PC

(57) ABSTRACT

A method of manufacturing semiconductor light emitting elements with improved yield and emission power uses laser lift-off and comprises the steps of forming a semiconductor grown layer formed of a first semiconductor layer, an active layer, and a second semiconductor layer on a first principal surface of a growth substrate; forming a plurality of junction electrodes apart on the second semiconductor layer and forming guide grooves arranged in a lattice to surround each of the junction electrodes in the second semiconductor layer; joining together a support and the semiconductor grown layer via the junction electrodes; projecting a laser to separate the growth substrate; dividing the semiconductor grown layer into respective element regions for the semiconductor light emitting elements; and cutting the support, thereby separating into the semiconductor light emitting elements. Removed regions include regions where the guide grooves are formed, and side walls of the second semiconductor layer formed by the guide grooves have a beveled shape at intersections of the guide grooves.

5 Claims, 7 Drawing Sheets

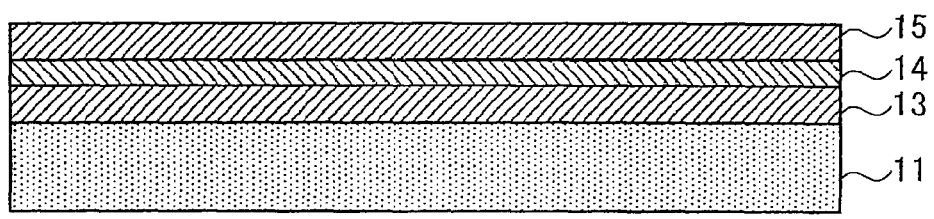
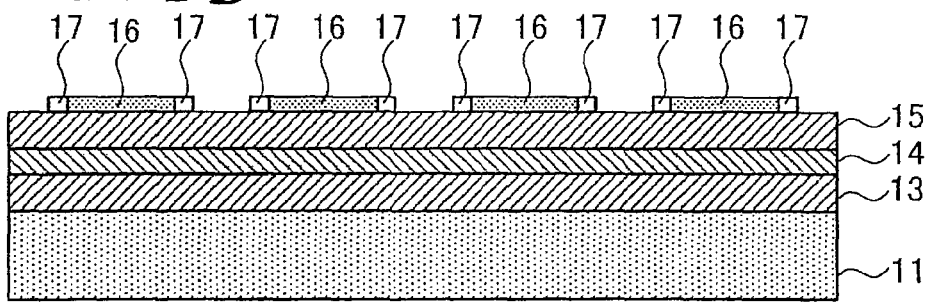
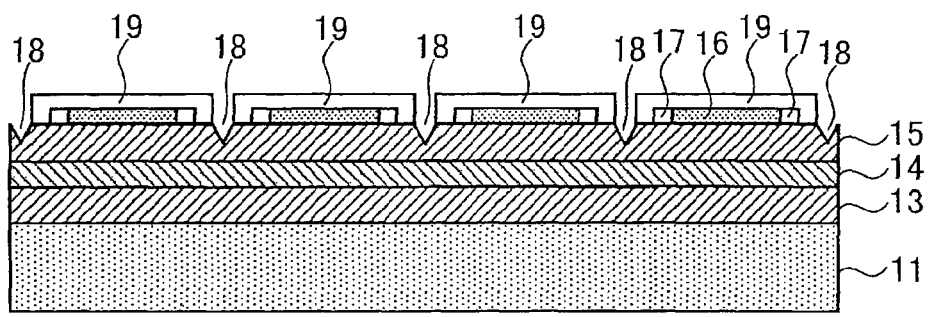
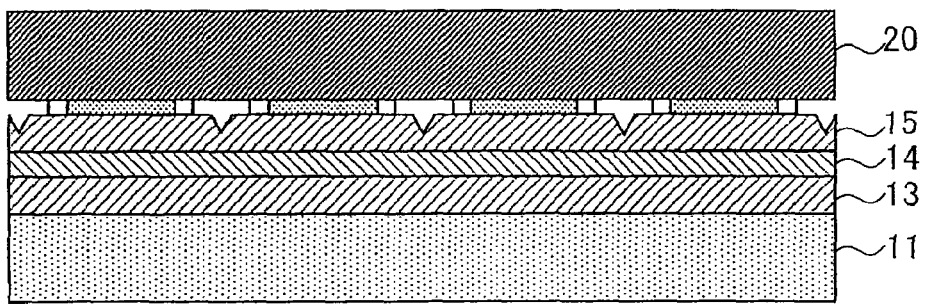

SCRIBE LINE

SCRIBE LINE p-ELECTRODE   GUIDE GROOVE

INTERSECTION OF GUIDE GROOVES

GUIDE GROOVE

CRACK

METHOD OF MANUFACTURING SEMICONDUCTOR LIGHT EMITTING ELEMENTS

BACKGROUND OF THE INVENTION

1. Field of the Invention

The present invention relates to a manufacturing method of manufacturing semiconductor light emitting elements by laying a plurality of semiconductor layers one over another on a growth substrate, and particularly to a manufacturing method having a process of separating the growth substrate from the stacked semiconductor layers by laser lift off (LLO).

2. Description of the Related Art

Conventionally, in the field of semiconductor light emitting devices having semiconductor films made mainly of $Al_xIn_yGa_zN$ ($0 \leq x \leq 1$, $0 \leq y \leq 1$, $0 \leq z \leq 1$, $x+y+z=1$), hetero-substrates which are inexpensive allowing of AlInGaN epitaxial growth and on which a semiconductor film of high quality can be crystal-grown have been used for crystal growth. For example, a sapphire substrate is used as the hetero-substrate. However, because the refractive index of the sapphire substrate for blue emission is lower than the refractive index of the semiconductor film, part of blue light emitted from the active layer is reflected back into the active layer, resulting in a decrease in the light extraction efficiency of the semiconductor light emitting device.

In order to solve this problem, in recent years, a so-called vertical type of semiconductor light emitting devices wherein the growth substrate used for the crystal growth of semiconductor films is removed, are attracting attention and are being actively studied. For the removal of the growth substrate, laser lift off (LLO), grinding and polishing, or dry etching is used. For example, Japanese Patent Kokai No. 2006-73619 (Patent Literature 1) and No. 2007-134415 (Patent Literature 2) disclose a method of manufacturing a semiconductor light emitting device using laser lift off.

In the method of manufacturing a semiconductor light emitting device using laser lift-off, separation grooves for releasing $N_2$ gas generated in laser lift-off to the outside of the wafer are usually formed before performing laser lift-off. The separation grooves are formed by dry etching so as to extend through the semiconductor films crystal-grown on the growth substrate and also function as scribe lines. However, because plasma for dry etching damages the semiconductor films, the problem occurs that the side surfaces (exposed through the separation grooves) of a p-clad layer that is one of the semiconductor films become high in resistance and that the side surfaces (exposed through the separation grooves) of the active layer that is one of the semiconductor films lose the light emitting function, resulting in a decrease in the emission power of the semiconductor light emitting device. Further, if impurities scattered during the dry etching and dust having entered in a subsequent process stick to exposed side surfaces of the active layer, the problem occurs that leakage is caused, resulting in a decrease in the yield of semiconductor light emitting elements.

In order to avoid these problems, it is possible to remove the growth substrate without the separation grooves provided (as in, e.g., Reference 2), but cracks will occur in the semiconductor films due to the volume expansion of $N_2$ gas and Ga produced in laser lift-off, resulting in a great decrease in the yield rate of semiconductor light emitting elements.

SUMMARY OF THE INVENTION

The present invention has been made in view of the above facts, and an object thereof is to provide a method of manufacturing semiconductor light emitting elements using laser lift-off which method can improve the yield and the emission power thereof.

In order to solve the above task, the present invention is a method of manufacturing semiconductor light emitting elements. The method comprises the steps of sequentially laying a first semiconductor layer of a first conductivity type, an active layer, and a second semiconductor layer of a second conductivity type one over another on a first principal surface of a growth substrate to form a semiconductor grown layer; forming a plurality of junction electrodes apart on the second semiconductor layer and forming guide grooves arranged in a lattice to surround each of the junction electrodes in the second semiconductor layer; joining together a support and the semiconductor grown layer via the junction electrodes; projecting a laser from a second principal surface side of the growth substrate to separate the growth substrate; dividing the semiconductor grown layer into respective element regions for the semiconductor light emitting elements by removing partially the semiconductor grown layer, the removed regions extending through the semiconductor grown layer; and cutting the support along the removed regions of the semiconductor grown layer, thereby separating into respective parts for the semiconductor light emitting elements. The removed regions include regions where the guide grooves are formed, and side walls of the second semiconductor layer formed by the guide grooves have a beveled shape at corners of intersections of the guide grooves.

In the method of manufacturing semiconductor light emitting elements according to the present invention, because guide grooves arranged in a lattice to surround each junction electrode are formed in the second semiconductor layer, the places where cracks occur at the laser lift-off performed subsequently can be controlled. Further, because the guide grooves are formed only in the second semiconductor layer, damage to the semiconductor grown layer in the formation of the guide grooves can be minimized.

Further, because in the process of removing parts of the semiconductor grown layer, the areas where the guide grooves are formed are also removed, the damaged parts in the formation of the guide grooves are removed, and thus semiconductor light emitting elements having high yield and high reliability can be manufactured.

Yet further, because the side walls of the second semiconductor layer formed by the guide grooves have a beveled shape at the intersection of the guide grooves, pressure due to gas generated in the laser lift-off can be dispersed. Thus, the growth substrate can be separated with high accuracy and easily.

As described above, according to the present invention, there is provided a method of manufacturing semiconductor light emitting elements using laser lift-off, which method can improve the yield and the emission power.

BRIEF DESCRIPTION OF THE DRAWINGS

FIGS. 1A to 1D are cross-sectional views showing production steps in Embodiment 1 of the method of manufacturing semiconductor light emitting elements according to the present invention;

DETAILED DESCRIPTION OF THE INVENTION

Embodiments of the present invention will be described below in detail with reference to the accompanying drawings.

A method of manufacturing semiconductor light emitting elements according to Embodiment 1 of the present invention will be described in detail with reference to FIGS. 1A to 5B.

(Growth Substrate Preparing Process)

In the present embodiment, a C-plane sapphire substrate 11 (hereinafter simply called a sapphire substrate 11) is prepared as a substrate (growth substrate) on which a semiconductor grown layer made of $Al_xIn_yGa_zN$ ($0 \leq x \leq 1$, $0 \leq y \leq 1$, $0 \leq z \leq 1$, $x+y+z=1$) can be formed by a metal organic chemical vapor deposition method (MOCVD). Note that an R-plane sapphire substrate or a substrate of $MgAl_2O_4$, SiC, or the like can be used as a growth substrate, not being limited to the C-plane sapphire substrate of this embodiment.

(Semiconductor Grown Layer Forming Process)

Figure 2:
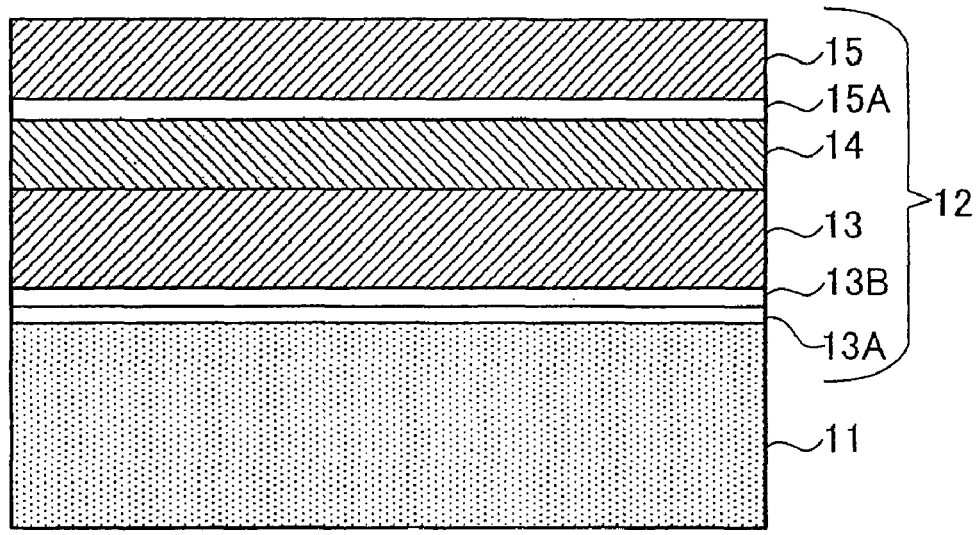
FIG. 2 is a cross-sectional view showing a semiconductor grown layer crystal-grown on a sapphire substrate.

Then, a semiconductor grown layer 12 made of $Al_xIn_yGa_zN$ ($0 \leq x \leq 1$, $0 \leq y \leq 1$, $0 \leq z \leq 1$, $x+y+z=1$) is formed on a first principal surface of the growth substrate 11 by MOCVD (FIGS. 1A and 2). The semiconductor layers forming the semiconductor grown layer 12 are sequentially laid one over another on the sapphire substrate 11 along a C-axis direction of a wurtzite-type crystal structure by the MOCVD method. Specifically, by undergoing the following steps, the semiconductor grown layer 12 is formed.

First, the sapphire substrate 11 is put in an MOCVD apparatus, and heating (thermal cleaning) for about 10 minutes in a hydrogen atmosphere of about 1,000 degrees centigrade (1,000° C.) is performed on the sapphire substrate 11. Subsequently, the substrate temperature (growth temperature) is adjusted to about 500° C., and TMG (trimethylgallium) at a flow rate of 10.4 μmol/min and $NH_3$ at a flow rate of 3.3 LM are supplied for about 3 minutes, thereby forming a low-temperature buffer layer 13A constituted by a GaN layer. Then, the substrate temperature is raised to about 1,000° C. and maintained for about 30 seconds to crystallize the low-temperature buffer layer 13A. Subsequently, with the substrate temperature kept at about 1,000° C., TMG at a flow rate of 45 μmol/min and $NH_3$ at a flow rate of 4.4 LM are supplied for about 20 minutes, thereby forming an underlying GaN layer 13B of about 1 μm thickness. Then, with the substrate temperature kept at about 1,000° C., TMG at a flow rate of 45 μmol/min, $NH_3$ at a flow rate of 4.4 LM, and $SiH_4$ as dopant gas at a flow rate of $2.7 \times 10^{-9}$ mol/min are supplied for about 120 minutes, thereby forming an n-type semiconductor layer 13 constituted by an n-type GaN layer of about 7 μm thickness.

Subsequently, an active layer 14 is formed on the n-type semiconductor layer 13. In the present embodiment, a multi-quantum well structure of InGaN/GaN is applied to the active layer 14, and with InGaN/GaN as a period, five periods of growth is performed. Specifically, at a substrate temperature of about 700° C., TMG at a flow rate of 3.6 μmol/min, TMI (trimethylindium) at a flow rate of 10 μmol/min, and $NH_3$ at a flow rate of 4.4 LM are supplied for about 33 seconds, thereby forming an InGaN well layer of about 2.2 nm thickness. Subsequently, TMG at a flow rate of 3.6 μmol/min and $NH_3$ at a flow rate of 4.4 LM are supplied for about 320 seconds, thereby forming a GaN barrier layer of about 15 nm thickness. By repeating this process five periods, the active layer 14 is formed.

Then, the substrate temperature is raised to about 870° C., and TMG at a flow rate of 8.1 μmol/min, TMA (trimethylaluminum) at a flow rate of 7.5 μmol/min, $NH_3$ at a flow rate of 4.4 LM, and CP2Mg (bis-cyclopentadienyl Mg) as a dopant at a flow rate of $2.9 \times 10^{-7}$ μmol/min are supplied for about 5 minutes, thereby forming the p-type AlGaN clad layer 15A of about 40 nm thickness. Subsequently, with the substrate temperature kept at about 870° C., TMG at a flow rate of 18 μmol/min, $NH_3$ at a flow rate of 4.4 LM, and CP2Mg as a dopant at a flow rate of $2.9 \times 10^{-7}$ μmol/min are supplied for about 7 minutes, thereby forming a p-type semiconductor layer (GaN layer) 15 constituted by a p-type GaN layer of about 150 nm thickness.

By performing the above process, the semiconductor grown layer 12 is formed, which is a laminated structure where the low-temperature buffer layer 13A, the underlying GaN layer 13B, the n-type semiconductor layer 13, the active layer 14, the p-type AlGaN clad layer 15A, and the p-type semiconductor layer 15 are sequentially laid one over another (see FIG. 2). Note that the low-temperature buffer layer 13A, the underlying GaN layer 13B, and the p-type AlGaN clad layer 15A are omitted from cross-sectional views of FIGS. 1A to 1D and 4A to 4D because they are very thin as compared with the other layers. Further, in the present embodiment, the sapphire substrate 11 that is a hexagonal crystal is used as the growth substrate. Hence, the semiconductor grown layer 12 grown on the sapphire substrate 11 is a group-III nitride semiconductor crystal having a wurtzite-type (hexagonal crystal) crystal structure.

(P-Electrode Forming Process)

Next, on desired areas of the surface of the p-type semiconductor layer 15, p-electrodes (junction electrodes) 16 and an insulating protection layer 17 are formed (FIG. 1B). More specifically, the p-electrodes 16 and the insulating protection layer 17 are formed such that the insulating protection layer 17 surrounds the p-electrodes 16. To be specific about the process, a resist is coated over the p-type semiconductor layer 15. Subsequently, the resist is patterned by photolithography. $SiO_2$ is deposited in the openings of the patterned resist by a widely known film forming technique such as a vacuum evaporation method or a sputtering method. Then, the resist is removed, and the insulating protection layer 17 is formed (a lift off method). Next, a resist is coated to cover the p-type semiconductor layer 15 and the insulating protection layer 17. Subsequently, the resist is patterned by photolithography. Pt (1 nm), Ag (150 nm), Ti (100 nm), Pt (100 nm), Ti (25 nm), W (100 nm), Ti (25 nm), Pt (10 nm), and Au (200 nm) are sequentially deposited in the openings of the patterned resist by electron beam evaporation. Then, the resist is removed, thereby finishing the p-electrodes 16. In this embodiment, each resist is patterned such that the insulating protection layer 17 surrounds the p-electrodes 16. With the above structure, the p-electrode 16 has excellent adhesion and ohmic characteristics with the p-type semiconductor layer 15, and an excellent junction characteristic with a support described later. Further, the p-electrode 16 efficiently reflects light emitted from the active layer 14 and can prevent the diffusion of deposited metal with high accuracy (particularly preventing it from entering the semiconductor grown layer 12).

(Guide Groove Forming Process)

Then, guide grooves 18 about 5 μm wide and about 100 nm deep are formed in the surface of the p-type semiconductor layer 15 (FIG. 1C). To be specific about the process, a resist 19 is coated to cover the p-electrodes 16 and the insulating protection layer 17. Subsequently, the resist 19 is patterned by photolithography. Then, the sapphire substrate 11 having the resist 19 coated thereon is put in a reactive ion etching (RIE) apparatus. Subsequently, the guide grooves 18 are formed in the surface of the p-type semiconductor layer 15 by dry etching using a mixed gas of $Cl_2$ and Ar as etching gas. Then, the resist 19 is removed.

The guide grooves 18 are formed only in the p-type semiconductor layer 15, without reaching the active layer 14. By this means, damage to the semiconductor grown layer 12 by plasma during dry etching can be suppressed to a minimum. The cross-section of the guide groove 18 is in a V shape in which its area becomes smaller when going deeper. Note that it may have a rectangular shape, not being limited to a V shape.

Figure 3:
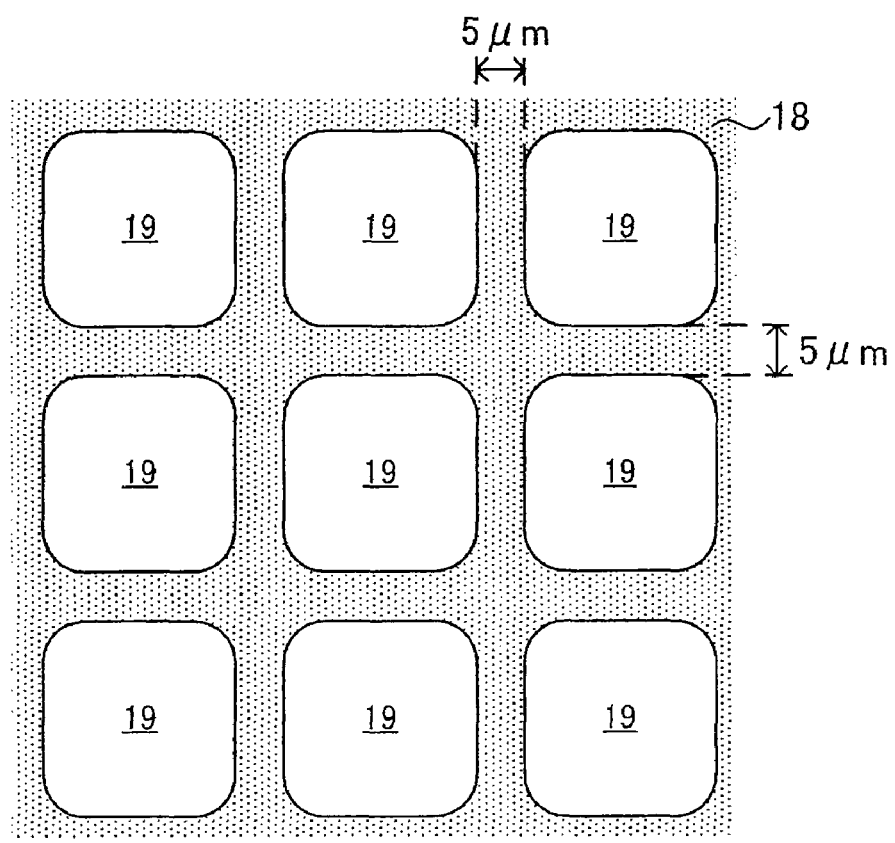
FIG. 3 is a plan view showing the production step shown in FIG. 1C.
Figure 5A:
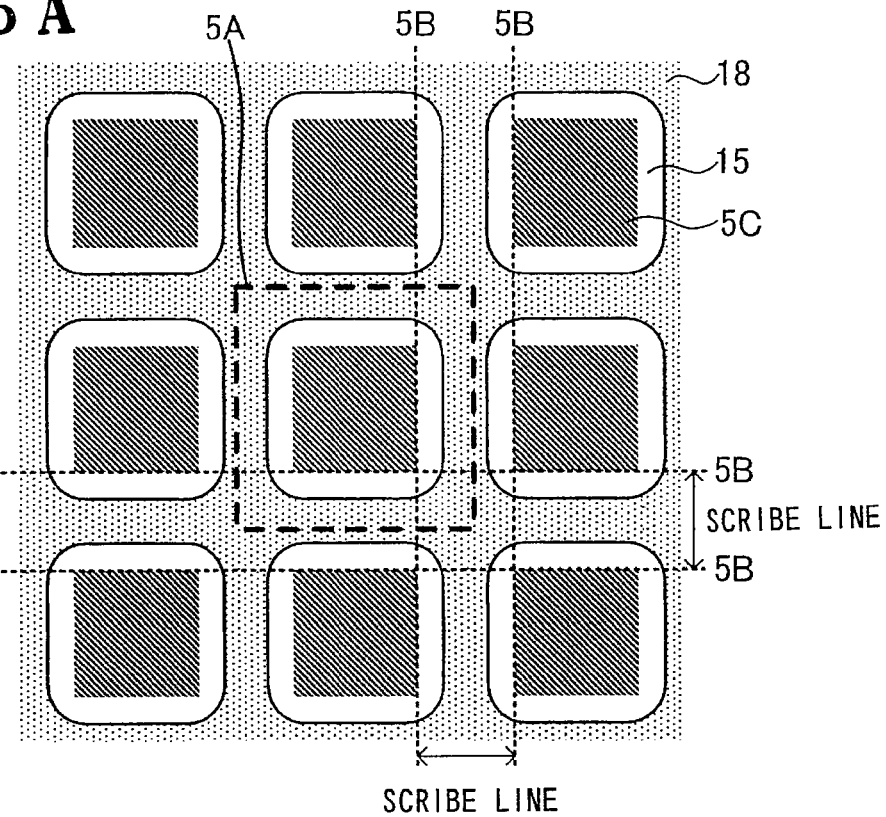
FIG. 5A is a schematic view for explaining the method for laser irradiation in laser lift-off.

FIG. 3 shows a plan view of the guide groove 18 as seen from the side on which the resist 19 is formed. As shown in FIG. 3, the guide grooves 18 are formed like a lattice in the surface of the p-type semiconductor layer 15. The side surfaces at the intersections of the guide grooves 18 are beveled in a round shape, forming a curved surface. Especially, as shown in FIG. 5A, in the surface of the p-type semiconductor layer 15, the side surfaces at the intersections of the guide grooves 18 are in a quadrant shape. The resist 19 is patterned such that its remaining parts are substantially square with each of their corners being beveled in a curved surface shape so that the guide grooves 18 as shown in FIG. 3 can be formed. Especially, in the surface of the p-type semiconductor layer 15, each corner of the remaining parts of the resist 19 is shaped like an arc (a quadrant). Thus, the side walls of the p-type semiconductor layer 15 formed by the guide grooves 18 are beveled in a curved surface shape at the intersections of the guide grooves 18. The reason why the guide grooves 18 and the side walls of the p-type semiconductor layer 15 are shaped as described above is to disperse pressure due to generated gas or the like when separating the sapphire substrate 11 as described later, and to increase the volume of regions where cracks will be formed as described later, which will be described in detail later.

The depth of the guide grooves 18 is preferably set at 10 to 120 nm. This is because if the depth is less than 10 nm, it is difficult to control areas where cracks will occur due to laser lift-off described later, and because if the depth is greater than 120 nm, cracks will stretch through the p-type semiconductor layer 15 and damage the active layer 14. That is, the remaining thickness of the p-type semiconductor layer 15 is preferably greater than or equal to 30 nm. Further, the width of the guide grooves 18 is preferably set to be in the range of 1 to 10%. This is because if the width is less than 1 μm, it is difficult to control areas where cracks will occur due to laser lift-off described later, and because if the width is greater than 10 μm, the number of semiconductor light emitting elements produced will decrease, leading to an increase in cost.

(Sticking Together Process)

After the guide grooves 18 are formed, the wafer obtained after undergoing the above processes (that is, the sapphire substrate 11 having the semiconductor grown layer 12 formed thereon) and a prepared support 20 are stuck together (FIG. 1D).

To be more specific about the process, first, the support 20 comprising a conductive support substrate (for example, a silicon substrate doped with boron), an electrode layer, and a solder layer is prepared. To be more specific about the structure, the electrode layer is formed by sputtering on a surface (first principal surface) of the conductive support substrate. The electrode layer is a multi-layer film formed of, e.g., titanium and platinum. The film thickness of titanium is about 25 nm, and the film thickness of platinum is about 100 nm. The solder layer in which Ni, Au, and AuSn are laid one over another in that order is formed by sputtering on the surface (second principal surface) opposite to the first principal surface of the conductive support substrate. The Ni forming part of the solder layer functions to absorb Sn when the AuSn is melted and also has the effect of suppressing the peel-off of AuSn when re-solidifying after melted. From the viewpoint of increasing the wettability of AuSn and suppressing the peel-off, the film thickness of the Ni is desirably greater than or equal to about 100 nm. Because Pt or Pd (palladium) also has the effect of suppressing the peel-off of AuSn when re-solidifying after melted, instead of the Ni, a layer of Pt or Pd may be formed. The Au forming part of the solder layer has the effects of improving the wettability of AuSn and preventing the oxidation of Ni. The film thickness of the Au is, for example, about 30 nm. The composition ratio of Au to Sn in the AuSn forming part of the solder layer is, for example, about 8:2 by weight, and about 7:3 by atomicity. The film thickness of the AuSn is, for example, about 600 nm.

Next, with the solder layer of the support 20 being opposite the p-electrodes 16 formed over the sapphire substrate 11, they are put in close contact. Then, the sapphire substrate 11 and the support 20 in close contact are thermally compression bonded in a nitrogen atmosphere.

Conditions for the thermal compression bonding are, for example, that the pressure is about 300 to 500 $N/cm^2$, the temperature is about 280° C. to 370° C., and the compression bonding time is about 10 minutes. By this thermal compression bonding, the AuSn is melted, and the Au and Ni dissolve in the melted AuSn. Further, the Au and Sn diffuse and are absorbed by the Ni. Subsequently, the melted AuSn solidifies, thereby completing the junction (sticking together) of the p-electrodes 16 and the support.

(Growth Substrate Separating Process)

Figure 4A:
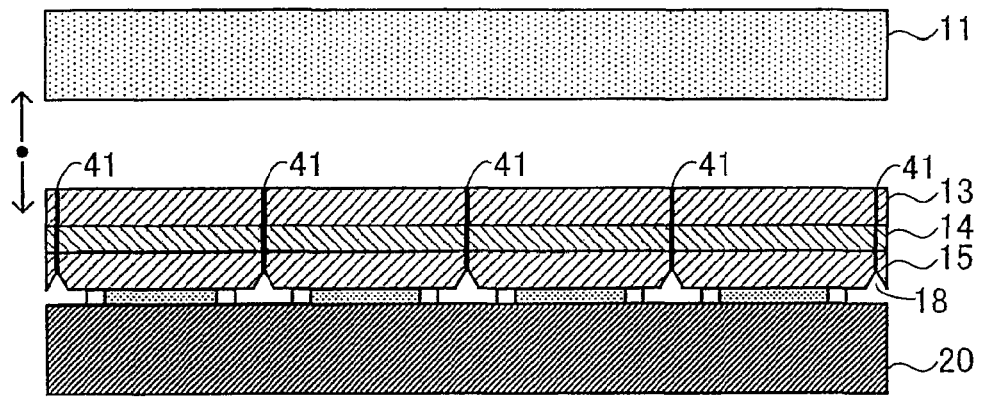
FIGS. 4A to 4D are cross-sectional views showing production steps in Embodiment 1 of the method of manufacturing semiconductor light emitting elements according to the present invention.
Figure 4B:
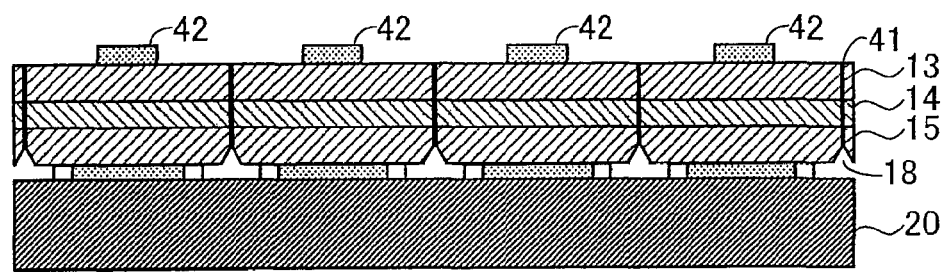
Figure 4C:
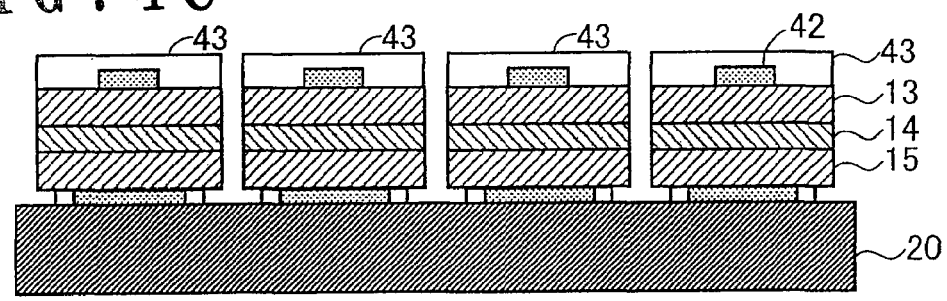
Figure 4D:
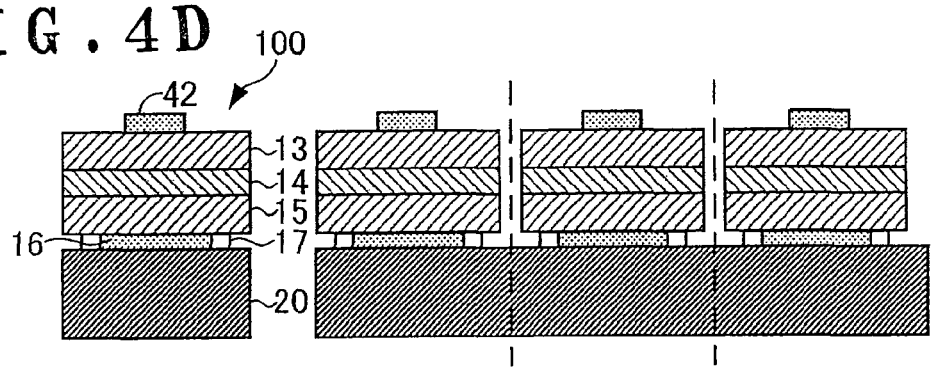

Then, the sapphire substrate 11 is separated from the semiconductor grown layer 12 by laser lift-off (LLO) (FIG. 4A). More specifically, laser light is projected onto the sapphire substrate 11 from the second principal surface side (on which surface the semiconductor grown layer 12 is not formed), and thereby the energy of the laser light is absorbed between the sapphire substrate 11 and the semiconductor grown layer 12. Further, the absorbed energy is converted into heat, and thereby a GaN layer formed on the sapphire substrate 11 is decomposed into metal Ga and $N_2$ gas. Hence, the decomposition occurs in the n-type semiconductor layer 13 or the underlying GaN layer 13B, and after the sapphire substrate 11 is separated, the n-type semiconductor layer 13 or the underlying GaN layer 13B is exposed. In either case, the outermost surface exposed after the sapphire substrate 11 is separated is a C− plane (N plane). Further, cracks 41 occur along the guide grooves 18 and extending from the guide grooves 18 through the semiconductor grown layer 12 due to pressure by metal Ga and $N_2$ gas generated. The cracks 41 extend along the guide grooves 18 and directly under the guide grooves 18. The reason why the cracks 41 occur in this way will be described later. The laser used in the laser lift-off in this embodiment is an excimer laser (wavelength: 266 nm).

Figure 5B:
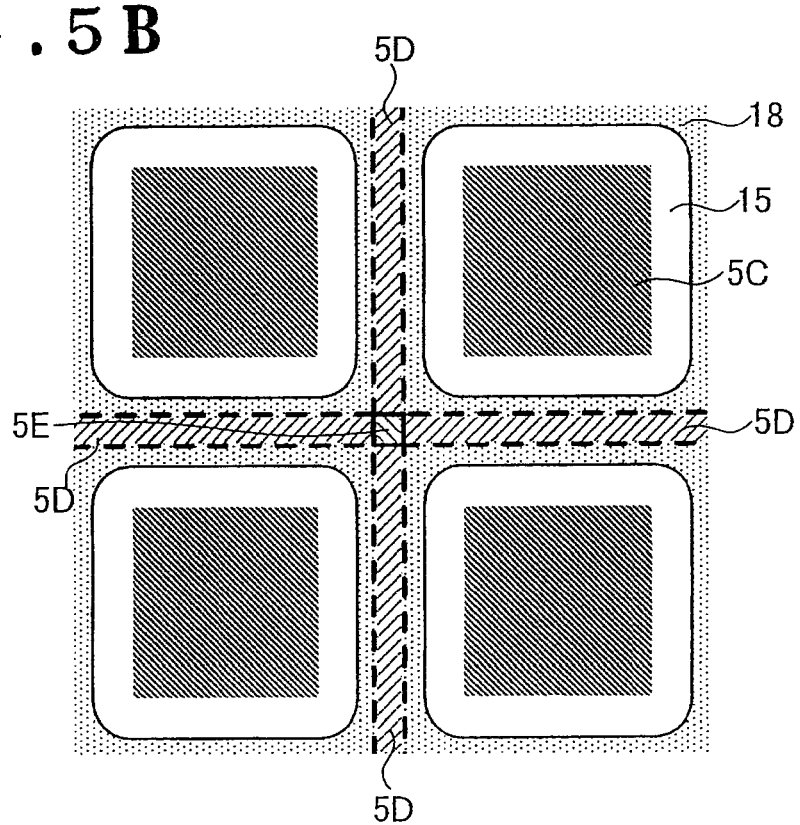
FIG. 5B is a schematic view for explaining the number of laser irradiation times.

Next, the method for laser irradiation will be described in detail with reference to FIGS. 5A and 5B. FIG. 5A is a horizontal cross-sectional view taken along the interface between the p-type semiconductor layer 15 and the p-electrode 16, and FIG. 5B is an enlarged view of FIG. 5A.

In FIG. 5A, the region enclosed by a dashed line 5A is a one-shot laser irradiation region. The region sandwiched by dotted lines 5B is a scribe line for an element separating process described later. Hatched regions 5C in the p-type semiconductor layer 15 are semiconductor light emitting element formed regions. As shown in FIG. 5A, the one-shot laser irradiation region is larger than one semiconductor light emitting element formed region, but the laser irradiation does not reach the adjacent semiconductor light emitting element formed regions and parts of the p-type semiconductor layer 15 surrounding them (parts of the p-type semiconductor layer 15 where no guide grooves 18 is formed). That is, the edges of the one-shot laser irradiation region are located in areas where guide grooves 18 are formed.

When the laser irradiation has finished for one semiconductor light emitting element formed region, the laser is projected onto an adjacent semiconductor light emitting element formed region. When the laser is projected onto adjacent semiconductor light emitting element formed regions in this way, the laser is projected twice (twofold) onto the middle of the guide groove 18 as shown in FIG. 5B, and the laser is projected four times (fourfold) onto the middle of the intersection of guide grooves 18. In FIG. 5B, regions onto which the laser is projected twofold are indicated by hatched regions 5D, and a region onto which the laser is projected fourfold is indicated by a hatched region 5E. Note that laser irradiation is performed only once for the regions other than the hatched regions 5D and 5E.

In the regions where laser irradiation is performed a plurality of times (the hatched regions 5D and 5E), the amount of metal Ga and $N_2$ gas generated is larger, and hence cracks 41 are more likely to occur than in the regions where laser irradiation is performed only once. Further, because the regions where laser irradiation is performed a plurality of times have the guide groove 18 formed therein, cracks 41 are more likely to occur than in the regions where no guide groove 18 is formed. Hence, cracks can be prevented from propagating into the semiconductor light emitting element formed regions. Thus, cracks 41 will occur along the guide grooves 18 and extending from the guide grooves 18 through the semiconductor grown layer 12. Moreover, because the regions where laser irradiation is performed a plurality of times are away from the semiconductor light emitting element formed regions (hatched regions 5C), the possibility that cracks 41 may occur in the semiconductor light emitting element formed regions is reduced.

(N-Electrode Forming Process)

Next, a resist is coated to cover the n-type semiconductor layer 13. Subsequently, the resist is patterned by photolithography. Ti (25 nm), Pt (100 nm), and Au (800 nm) are sequentially deposited in the openings of the patterned resist by electron beam evaporation. Then, the resist is removed, thereby finishing the n-electrodes 42. Because the exposed surface of the n-type semiconductor layer 13 is the light emitting surface, the n-electrode 42 is preferably formed such that the n-electrode 42 has a minimum area necessary for wire bonding when the semiconductor light emitting element is mounted. In this embodiment, the resist is patterned such that the n-electrode 42 is located in the center of the n-type semiconductor layer 13 of each semiconductor light emitting element. Note that in order to improve the light extraction efficiency of the semiconductor light emitting element, either before or after this process, etching with an alkaline solution such as KOH may be performed on the exposed surface of the n-type semiconductor layer 13 to form a recess/protrusion structure in the exposed surface.

(Semiconductor Grown Layer Dividing Process)

Then, the semiconductor grown layer 12 is divided (partitioned) into respective parts for individual semiconductor light emitting elements by wet etching. More specifically, a resist 43 is coated to cover the n-type semiconductor layer 13 and the n-electrodes 42. Subsequently, the resist 43 is patterned by photolithography. Further, the wafer having undergone (that is, the support 20 having the p-electrodes 16, the semiconductor grown layer 12, the n-electrodes 42, and the resist 43 stacked thereon) is immersed in an alkaline solution such as potassium hydroxide (KOH) to perform wet etching on the openings of the resist 43. By this means, parts of the semiconductor grown layer 12 corresponding to the openings of the resist 43 are removed, thereby dividing the semiconductor grown layer 12 into respective parts for individual semiconductor light emitting elements. The removed regions of the semiconductor grown layer 12 are set to extend along and include the areas where guide grooves 18 are formed. Hence, after the removed regions of the semiconductor grown layer 12 are removed, the guide grooves 18 and cracks 41 do not remain.

The above removal of the semiconductor grown layer 12 by wet etching can reduce damage to the semiconductor grown layer 12 and the amount of scattered particles sticking as compared with the scribe line formation by dry etching, resulting in an improvement in the luminous efficacy and yield of the semiconductor light emitting element.

The growth direction side (the surface on the p-type semiconductor layer 15 side opposite from the sapphire substrate 11) of the semiconductor grown layer 12, formed in the semiconductor grown layer forming process described previously, is always of stable Ga polarity (also called C+plane or C+growth), and hence it is difficult to remove the semiconductor grown layer 12 by wet etching using an alkaline solution such as KOH. Meanwhile, the exposed surface of the n-type semiconductor layer 13 exposed by removing the sapphire substrate 11 is of N polarity (also called C− plane or C− growth) and chemically unstable having the property of dissolving in an alkaline solution such as KOH or TMAH. Further, because cracks 41 occur along the guide grooves 18, the KOH easily goes in, and thus the etching time can be reduced.

The width of the removed regions of the semiconductor grown layer 12 is larger than the width (in this embodiment, 5 μm) of the guide grooves 18. By setting the width of the removed regions in this way, the areas of the p-type semiconductor layer 15 damaged when the guide grooves 18 were formed can be removed. By this means, the damaged areas do not remain in the semiconductor light emitting elements, resulting in an improvement in the reliability and yield of the semiconductor light emitting element. Further, the corners of the guide grooves 18 are beveled in a round shape, and cracks 41 occur directly under the guide grooves 18. Hence, cracks 41 occurring can be confined to within the removed regions of the semiconductor grown layer 12.

(Element Separating Process)

Next, by cutting the support 20 by dicing, the wafer having the semiconductor grown layer 12 divided is separated into chips of semiconductor light emitting elements. For the method of separating into chips, point scribe/breaking, laser scribe, or the like can be used, not being limited to dicing.

By undergoing the above steps, the semiconductor light emitting elements 100 according to this embodiment are finished.

Next, the effect produced by the guide grooves 18 and the shape of the side walls of the p-type semiconductor layer 15 formed by the guide grooves 18 will be described with reference to FIGS. 5A to 7B.

In the manufacturing method according to this embodiment, because through grooves extending through the semiconductor grown layer are not formed as in the conventional art, metal Ga and $N_2$ gas generated due to laser lift-off are not easily released outside, and part of the gas is released through cracks 41 occurring in the guide grooves 18. Accordingly, in this embodiment, in order to efficiently release the gas to the outside of the wafer, the side surfaces at the intersections of the guide grooves 18 are shaped like a curved surface so as to make the side walls of the p-type semiconductor layer 15 formed by the guide grooves 18 beveled in a curved surface shape. With the guide grooves 18 and the shape of the side walls of the p-type semiconductor layer 15, the spaces where cracks 41 are likely to occur can be increased in volume, and thus the gas can be efficiently released to the outside of the wafer through the cracks.

Further, as described above, in laser lift-off, laser irradiation is performed for each semiconductor light emitting element. Thus, the laser is projected twice onto the middle of the guide groove 18 (the hatched regions 5D of FIG. 5B), and the laser is projected four times onto the middle of the intersection of guide grooves 18 (the hatched region 5E of FIG. 5B). Hence, the amount of metal Ga and $N_2$ gas generated at the intersection of guide grooves 18 is larger, and if the guide grooves 18 are shaped like a simple lattice, pressure due to metal Ga and $N_2$ gas is likely to be concentrated in the corners (of the intersection of guide grooves 18). In parts where such concentration of pressure occurs, the possibility that a crack may occur in an unintended region (for example, the semiconductor light emitting element formed region 5C) is increased. In the present embodiment, in order to disperse pressure due to metal Ga and $N_2$ gas, the side surfaces at the intersections of the guide grooves 18 are shaped like a curved surface so as to make the side walls of the p-type semiconductor layer 15 formed by the guide grooves 18 beveled in a curved surface shape.

Figure 6A:
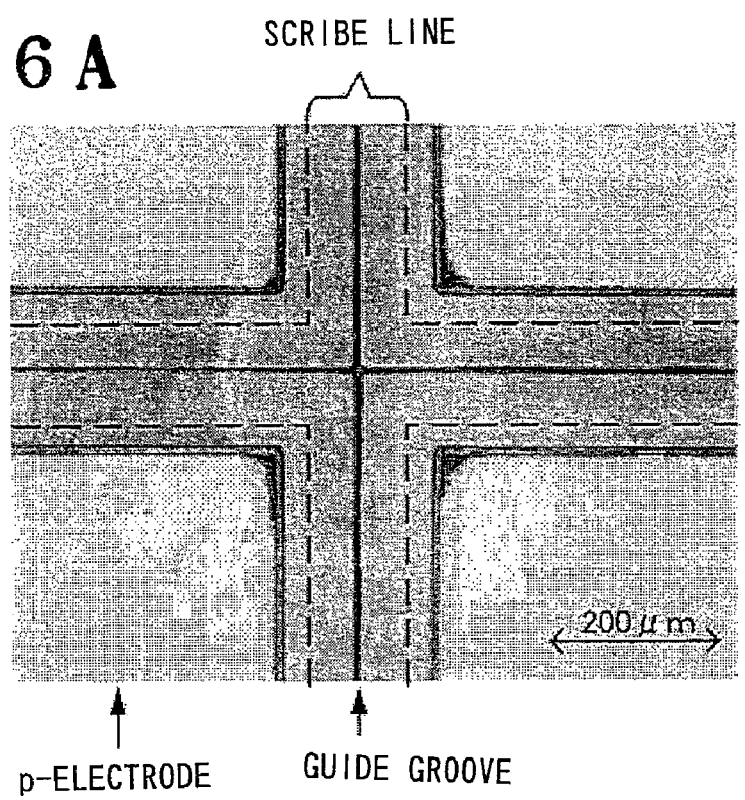
FIG. 6A is a microscope photograph of the stripped surface after the sapphire substrate is separated in the method of manufacturing semiconductor light emitting elements according to Embodiment 1 of the present invention.
Figure 6B:
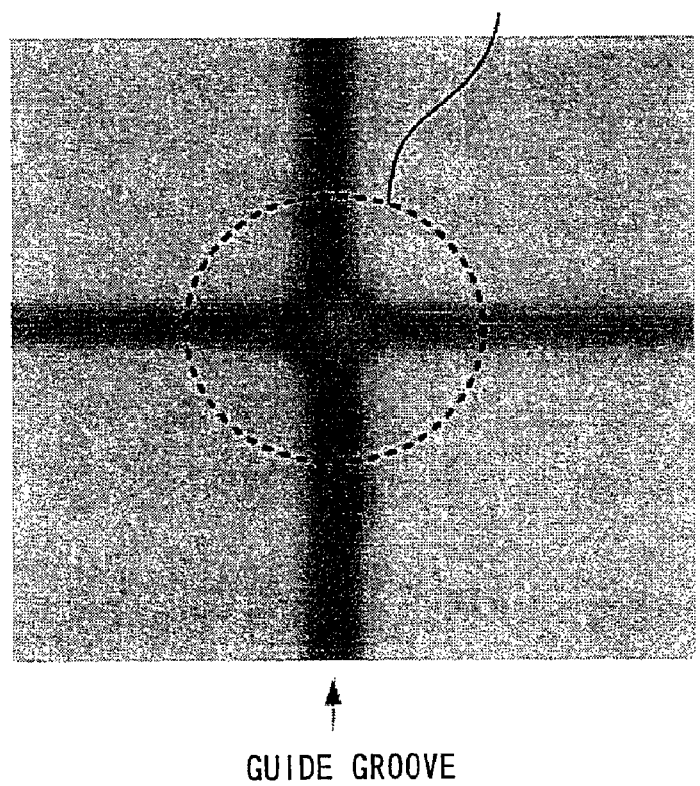
FIG. 6B is an enlarged photograph of the intersection of guide grooves of FIG. 6A.
Figure 7A:
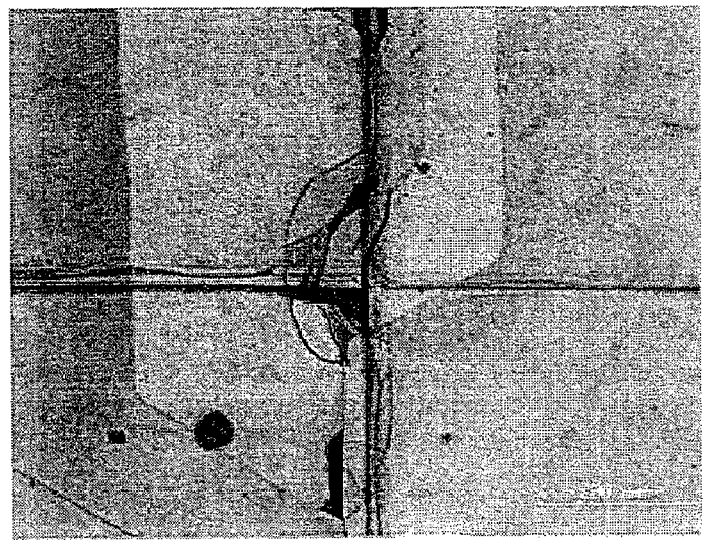
FIG. 7A is a microscope photograph of the stripped surface after laser lift-off is performed by a method different than in the manufacturing method according to Embodiment 1 of the present invention.
Figure 7B:
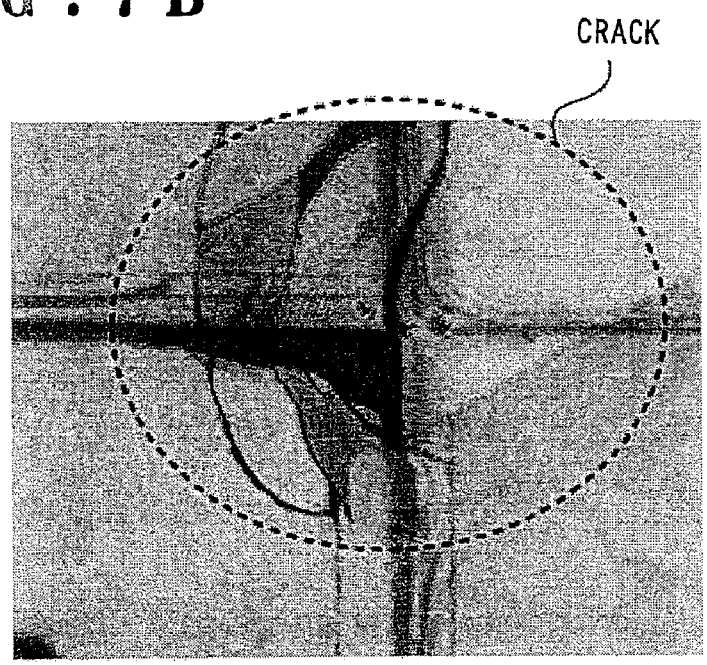
FIG. 7B is an enlarged photograph of the intersection of guide grooves of FIG. 7A.

FIGS. 6A and 6B are a microscope photograph of a sample produced by the manufacturing method of the present embodiment and an enlarged photograph of the intersection of guide grooves 18, and FIGS. 7A and 7B are a microscope photograph and an enlarged photograph of the intersection of guide grooves for the case where guide grooves are shaped like a simple lattice (that is, their corners are not beveled, but the depth and the groove cross-sectional shape are the same as those of the guide grooves 18 of this embodiment). Note that in the case where guide grooves are shaped like a simple lattice, because the sapphire substrate could not be removed, photographs of a sample including the sapphire substrate are shown. As can be seen from FIGS. 6A and 6B, in the sample produced by the manufacturing method of the present embodiment, cracks 41 did not occur other than in areas where the guide grooves 18 are formed. Meanwhile, as can be seen from FIGS. 7A and 7B, in the sample in which the guide grooves are shaped like a simple lattice, cracks were distributed across the entire semiconductor grown layer. As can be seen from these results, by shaping the corners of the intersection of the guide grooves 18 in a curve, pressure due to metal Ga and $N_2$ gas can be dispersed, and thus the separation of the sapphire substrate 11 becomes easier, and the yield and reliability of the semiconductor light emitting element can be improved.

Figure 8:
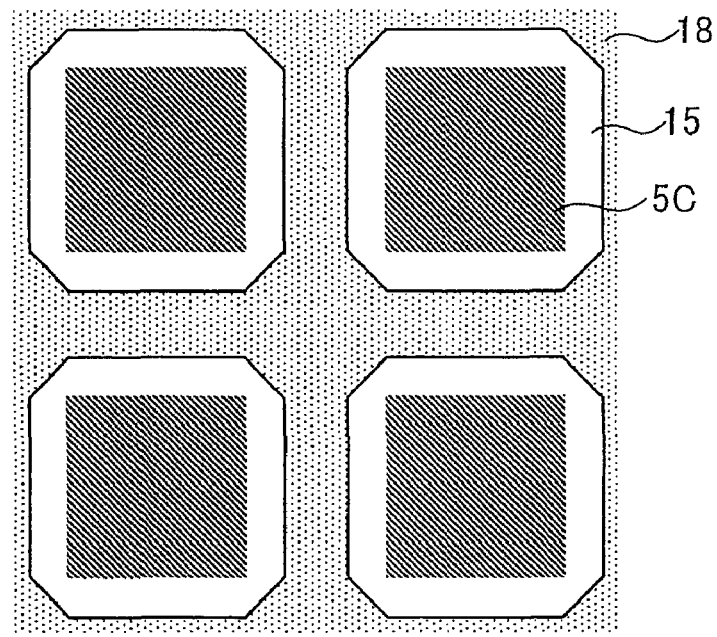
FIG. 8 is a plan view showing a variant of guide grooves formed in Embodiment 1 of the method of manufacturing semiconductor light emitting elements according to the present invention.

Note that the side walls of the p-type semiconductor layer 15 formed by the guide grooves 18 may be beveled in a sloping surface shape, not being limited to being beveled in a curved surface shape. That is, the corners of the intersection of the guide grooves 18 may be in a sloping surface shape as shown in FIG. 8. It is expected that also in this case, pressure due to metal Ga and $N_2$ gas generated can be dispersed sufficiently.

Moreover, the formation of the guide grooves 18 can be performed at any stage as long as it is after the forming process for the semiconductor grown layer 12 (FIG. 1A) and before the sticking together process with the support 20 (FIG. 1D). For example, after the guide grooves 18 are formed, the p-electrodes 16 and the insulating protection film 17 may be formed.

As described above, in the method of manufacturing semiconductor light emitting elements according to the present invention, because guide grooves arranged in a lattice to surround each p-electrode are formed in the p-type semiconductor layer, the places where cracks occur at the laser lift-off performed subsequently can be controlled. Further, because the guide grooves are formed only in the p-type semiconductor layer, damage to the semiconductor grown layer in the formation of the guide grooves can be minimized.

Further, because in the process of removing parts of the semiconductor grown layer, the areas where the guide grooves are formed are also removed, the damaged parts in the formation of the guide grooves are removed, and thus semiconductor light emitting elements having high yield and high reliability can be manufactured.

Yet further, because the side walls of the p-type semiconductor layer formed by the guide grooves have a beveled shape at the intersection of the guide grooves, pressure due to gas generated in the laser lift-off can be dispersed. Thus, the growth substrate can be separated with high accuracy and easily.

That is, according to the present invention, there can be provided a method of manufacturing semiconductor light emitting elements using laser lift-off, which method can improve the yield and the emission power.

In order to prevent cracks that occur due to the laser lift-off from stretching into the semiconductor light emitting element formed regions, a groove opening may be formed in the intersection of guide grooves. The groove opening will be described with reference to FIG. 9. The same reference numerals are used to denote the same parts as in Embodiment 1, with description thereof being omitted.

Figure 9:
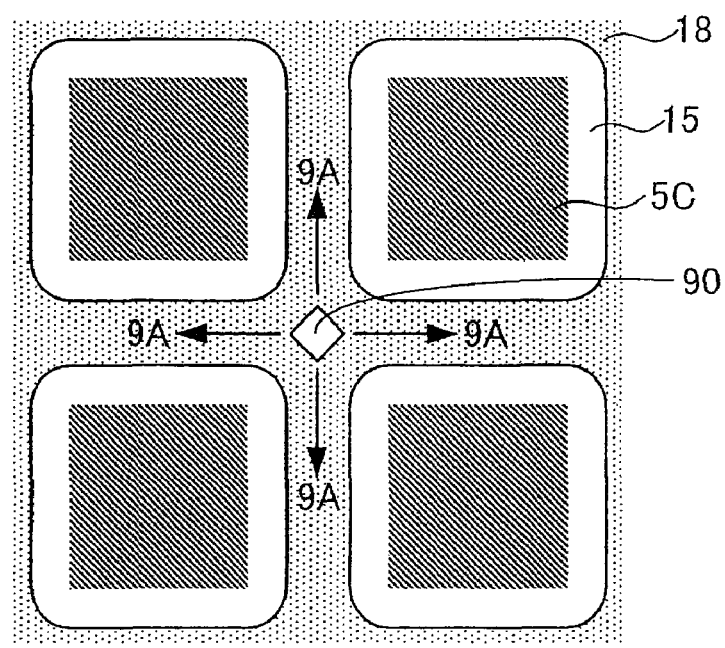
FIG. 9 is a plan view of guide grooves formed in Embodiment 2 of the method of manufacturing semiconductor light emitting elements according to the present invention.

As shown in FIG. 9, a groove opening 90 is formed only in the intersection of guide grooves 18. The groove opening 90 is deeper than the guide grooves 18 and formed to extend through the semiconductor grown layer 12. Further, the groove opening 90 is shaped in a tetragon in the cross-section along a plane parallel to the surface of the p-type semiconductor layer 15, and its diagonal lines extend in the directions that the guide grooves 18 extend. Although in the present embodiment this cross-section is square, it may be, for example, rhombic or rectangular. By providing this groove opening 90, pressure due to metal Ga and N₂ gas generated in the laser lift-off is applied in the directions of arrows 9A, so that cracks are likely to occur in the directions that the guide grooves 18 extend. Also, the groove opening 90 is expected to be an exhaust path to exhaust metal Ga and N₂ gas generated to the outside of the wafer.

At the intersection of the guide grooves 18, because the laser is projected four times (see FIG. 5B), a crack is more likely to occur than at the other areas. Hence, by providing the groove opening 90 in this place where a crack is likely to occur, the directions of cracks stretching are expected to be efficiently controlled. Further, because the intersection of the guide grooves 18 is further away from the semiconductor light emitting element formed regions 5C than the other regions of the guide grooves 18, damage to the semiconductor grown layer 12 at the formation of the groove opening 90 can be suppressed.

Next, the forming process of the groove opening 90 will be described. First, after the guide grooves 18 are formed, the resist 19 for forming the guide grooves 18 is removed, and a resist is coated to cover the p-electrodes 16, the insulating protection layer 17, and the guide grooves 18. Subsequently, the resist is patterned by photolithography such that an opening is located only in the intersection of the guide grooves 18. Then, the groove opening 90 is formed by dry etching using a mixed gas of Cl₂ and Ar as etching gas. Since the production process other than this is the same as in Embodiment 1, description thereof is omitted.

Note that the groove opening 90 may not extend through the semiconductor grown layer 12 as long as formed deeper in the growth direction of the semiconductor grown layer 12 than the guide grooves 18. It is expected that also in this case, the places where cracks occur can be controlled sufficiently.

This application is based on Japanese Patent Application No. 2009-252902 which is herein incorporated by reference.

What is claimed is:

1. A method of manufacturing semiconductor light emitting elements, the method comprising the steps of:
    sequentially laying a first semiconductor layer of a first conductivity type, an active layer, and a second semiconductor layer of a second conductivity type one over another on a first principal surface of a growth substrate to form a semiconductor grown layer;
    forming a plurality of junction electrodes apart on said second semiconductor layer and forming guide grooves arranged in a lattice to surround each of said junction electrodes in said second semiconductor layer;
    joining together a support and said semiconductor grown layer via said junction electrodes;
    projecting a laser from a second principal surface side of said growth substrate to separate said growth substrate;
    dividing said semiconductor grown layer into respective element regions for said semiconductor light emitting elements by removing partially said semiconductor grown layer, the removed regions extending through said semiconductor grown layer; and
    cutting said support along the removed regions of said semiconductor grown layer, thereby separating into said semiconductor light emitting elements,
    wherein said removed regions include regions where said guide grooves are formed, and side walls of said second semiconductor layer formed by said guide grooves have a beveled shape at intersections of said guide grooves,
    wherein after said guide grooves are formed, a groove opening deeper than said guide grooves is further formed in a center portion of each of said intersections, and
    wherein said groove opening has a tetragon shape in cross-section along a plane parallel to a surface of said second semiconductor layer, and diagonal lines of said groove opening extend in directions that said guide grooves extend.

2. The manufacturing method according to claim 1, wherein said beveled shape is a curved surface shape.

3. The manufacturing method according to claim 2, wherein an alkaline solution is used in the removal of said semiconductor grown layer.

4. The manufacturing method according to claim 1, wherein an alkaline solution is used in the removal of said semiconductor grown layer.

5. A manufacturing method according to claim 1, wherein said groove opening extends through said semiconductor grown layer.

* * * * *